(12) United States Patent
Wan

(10) Patent No.: US 6,690,223 B1
(45) Date of Patent: Feb. 10, 2004

(54) SYSTEM AND METHOD FOR SHIFTING THE PHASE OF A CLOCK SIGNAL

(75) Inventor: Ssu-ai Wan, San Jose, CA (US)

(73) Assignee: Bay Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/033,200

(22) Filed: Dec. 27, 2001

(51) Int. Cl.[7] ................................................. H03K 5/13
(52) U.S. Cl. ....................................... 327/251; 327/233
(58) Field of Search ................................. 327/233, 235, 327/237, 251, 257, 261, 269–271, 276–277, 284

(56) References Cited

U.S. PATENT DOCUMENTS

| 5,319,369 A | * | 6/1994 | Majos et al. | 341/101 |
| 5,517,156 A | * | 5/1996 | Ikuzawa | 331/16 |
| 6,104,223 A | * | 8/2000 | Chapman et al. | 327/276 |
| 6,510,191 B2 | * | 1/2003 | Bockelman | 375/371 |
| 6,518,920 B2 | * | 2/2003 | Proctor et al. | 342/367 |

* cited by examiner

Primary Examiner—Timothy P. Callahan
Assistant Examiner—Cassandra Cox
(74) Attorney, Agent, or Firm—Morrison & Foerster LLP

(57) ABSTRACT

An embodiment of this invention pertains to a digital circuit that shifts the phase of a clock signal. In this embodiment, multiple delay units, e.g., buffers, shift the clock signal multiple times and store a level of the clock signal within corresponding memory devices, e.g., flip-flops when triggered by the phase shifted clock signals. These levels may be at a high level (e.g., the clock signal has the value "1") or a low level (e.g., the clock signal has the value "0"). A "phase selection table" stores multiple entries, each of the entries includes multiple clock level values. Each of the entries specifies values used to determine when the phase shifted clock signals transition from the high level to the low level. This transition point signifies a 180 degree phase shift. Using this transition point, other phase shifts can be determined. Each of the entries specifies a particular one of the multiple delay units that provides the desired clock phase shift amount given different transition points occurring due to different operating conditions. The output from the specified delay unit is transmitted to an external device that uses the clock signal having this phase shift.

34 Claims, 6 Drawing Sheets

Phase Shift Determination Unit
105

Fig. 4

| Entry | Position Number | | | | | | | | | | | | | | | | | | | | | | | | | | | | | | | Buffer Selection Signal |
|---|---|---|---|---|---|---|---|---|---|---|---|---|---|---|---|---|---|---|---|---|---|---|---|---|---|---|---|---|---|---|---|
| | 1 | | | | 5 | | | | | 10 | | | | | 15 | | | | | 20 | | | | | 25 | | | | | 30 | | |
| 1 | 1 | ? | ? | ? | ? | ? | ? | ? | ? | ? | ? | ? | ? | ? | ? | ? | ? | ? | ? | ? | ? | ? | ? | ? | ? | ? | ? | ? | ? | ? | ? | 250 |
| 2 | 1 | ? | 0 | ? | ? | ? | ? | ? | ? | ? | ? | ? | ? | ? | ? | ? | ? | ? | ? | ? | ? | ? | ? | ? | ? | ? | ? | ? | ? | ? | ? | 252 |
| 3 | 1 | ? | 1 | ? | 0 | ? | ? | ? | ? | ? | ? | ? | ? | ? | ? | ? | ? | ? | ? | ? | ? | ? | ? | ? | ? | ? | ? | ? | ? | ? | ? | 254 |
| 4 | 1 | ? | 1 | ? | 1 | ? | 0 | ? | ? | ? | ? | ? | ? | ? | ? | ? | ? | ? | ? | ? | ? | ? | ? | ? | ? | ? | ? | ? | ? | ? | ? | 256 |
| 5 | 1 | ? | 1 | ? | 1 | ? | 1 | ? | 0 | ? | ? | ? | ? | ? | ? | ? | ? | ? | ? | ? | ? | ? | ? | ? | ? | ? | ? | ? | ? | ? | ? | 258 |
| 6 | 1 | ? | 1 | ? | 1 | ? | 1 | ? | 1 | ? | 0 | ? | ? | ? | ? | ? | ? | ? | ? | ? | ? | ? | ? | ? | ? | ? | ? | ? | ? | ? | ? | 260 |
| 7 | 1 | ? | 1 | ? | 1 | ? | 1 | ? | 1 | ? | 1 | ? | 0 | ? | ? | ? | ? | ? | ? | ? | ? | ? | ? | ? | ? | ? | ? | ? | ? | ? | ? | 262 |
| 8 | 1 | ? | 1 | ? | 1 | ? | 1 | ? | 1 | ? | 1 | ? | 1 | ? | 0 | ? | ? | ? | ? | ? | ? | ? | ? | ? | ? | ? | ? | ? | ? | ? | ? | 264 |
| 9 | 1 | ? | 1 | ? | 1 | ? | 1 | ? | 1 | ? | 1 | ? | 1 | ? | 1 | ? | 0 | ? | ? | ? | ? | ? | ? | ? | ? | ? | ? | ? | ? | ? | ? | 266 |
| 10 | 1 | ? | 1 | ? | 1 | ? | 1 | ? | 1 | ? | 1 | ? | 1 | ? | 1 | ? | 1 | ? | 0 | ? | ? | ? | ? | ? | ? | ? | ? | ? | ? | ? | ? | 268 |
| 11 | 1 | ? | 1 | ? | 1 | ? | 1 | ? | 1 | ? | 1 | ? | 1 | ? | 1 | ? | 1 | ? | 1 | ? | 0 | ? | ? | ? | ? | ? | ? | ? | ? | ? | ? | 270 |
| 12 | 1 | ? | 1 | ? | 1 | ? | 1 | ? | 1 | ? | 1 | ? | 1 | ? | 1 | ? | 1 | ? | 1 | ? | 1 | ? | 0 | ? | ? | ? | ? | ? | ? | ? | ? | 272 |
| 13 | 1 | ? | 1 | ? | 1 | ? | 1 | ? | 1 | ? | 1 | ? | 1 | ? | 1 | ? | 1 | ? | 1 | ? | 1 | ? | 1 | ? | 0 | ? | ? | ? | ? | ? | ? | 274 |
| 14 | 1 | ? | 1 | ? | 1 | ? | 1 | ? | 1 | ? | 1 | ? | 1 | ? | 1 | ? | 1 | ? | 1 | ? | 1 | ? | 1 | ? | 1 | ? | 0 | ? | ? | ? | ? | 276 |
| 15 | 1 | ? | 1 | ? | 1 | ? | 1 | ? | 1 | ? | 1 | ? | 1 | ? | 1 | ? | 1 | ? | 1 | ? | 1 | ? | 1 | ? | 1 | ? | 1 | ? | 0 | ? | ? | 278 |
| 16 | 1 | ? | 1 | ? | 1 | ? | 1 | ? | 1 | ? | 1 | ? | 1 | ? | 1 | ? | 1 | ? | 1 | ? | 1 | ? | 1 | ? | 1 | ? | 1 | ? | 1 | ? | ? | 280 |

Phase Selection Table
204

SYSTEM AND METHOD FOR SHIFTING THE PHASE OF A CLOCK SIGNAL

BACKGROUND OF THE INVENTION

1. Field of the Invention

This invention relates generally to a clock generator, and more specifically, a digital device for phase shifting the clock signal.

2. Description of the Related Art

A clock signal is a steady stream of timing pulses used, for example, to synchronize multiple devices of a system. Some devices may use a clock signal that has a different phase than the clock signal of the system. Typically, the phase of the clock signal is shifted using an analog phase-locked loop ("PLL") circuit. A disadvantage of using the analog PLL circuit to shift the phase of the clock signal is that the analog PLL circuit design is dependent on the foundry that produces that circuit on the silicon chip. That is, the design of the PLL circuit used to achieve a desired phase shift varies from foundry to foundry. Because of this dependence, a different analog PLL circuit design may have to be developed in order to achieve the desired phase shift when moving from one foundry to another. Another disadvantage is that the analog PLL circuit is mainly composed of resistors and capacitors and these resistors and capacitors occupy a substantial area of the chip given the present integrated-circuit fabrication technology. The analog PLL circuit is also susceptible to noise.

The phase shift may also be accomplished using a digital circuit. Compared to the analog circuit, the clock phase shift produced by a digital circuit provides less variations when moving from one foundry to another. Also, the digital circuit occupies less area on the chip than the analog PLL circuit. The disadvantage of using the digital circuit is that the phase shift it produces is affected by temperature changes and voltage variations. These operating condition variations cause the resulting phase shift to differ from the desired phase shift.

For the foregoing reasons, it is desirable to have a clock signal phase shift system that is foundry independent, provides accurate phase shifting regardless of operating conditions (e.g., excessive noise, and temperature and voltage variations), and occupies a smaller area on the chip than the analog PLL circuit.

SUMMARY OF THE INVENTION

According to an embodiment of the present invention, a method is described to shift the phase of a clock signal by a desired phase shift amount. This method includes generating multiple phase shifted clock signals and then determining a particular one of the multiple phase shifted clock signals that provides the desired phase shift amount.

According to an embodiment of the present invention, a system to shift the phase of a clock signal by a desired phase shift amount is described. This system includes a phase shift determination unit to generate multiple phase shifted clock signals and to determine a particular one of the multiple phase shifted clock signals that provides the desired phase shift amount.

According to an embodiment of the present invention, a system to shift the phase of a clock signal by a desired phase shift amount is described. This system includes multiple delay units, each of the multiple delay units are coupled together to form a chain. The multiple delay units shift the clock signal multiple times to generate the multiple phase shifted clock signals. This system also includes multiple memory devices, each of the multiple memory devices are coupled to a corresponding one of the multiple delay units. The multiple memory devices store multiple clock characteristics of the clock signal when triggered by the multiple phase shifted clock signals. A phase selection table indicates a particular one of the multiple delay units that provides a particular one of the multiple phase shifted clock signals that has the desired phase shift amount. Also included is a phase selection controller that is coupled to the multiple memory devices and the phase selection table. The phase selection controller processes the multiple clock characteristics to find the particular one of the plurality of phase shifted clock signals that has the desired phase shift amount.

BRIEF DESCRIPTION OF THE DRAWINGS

FIG. 4 shows an embodiment of a phase selection table according to the present invention.

DETAILED DESCRIPTION OF THE INVENTION

In an embodiment of the present invention, a digital circuit is used to shift the phase of the clock signal. The digital circuit is foundry independent because its digital components (e.g., buffers) act as a switch rather than as linear components as is the case in the analog circuit. Also, the digital circuit uses a "phase selection table" to determine the clock signal having the desired phase shift amount independently of foundry variations, and temperature and voltage variations. In this embodiment, multiple delay units (e.g., buffers) shift the clock signal multiple times and store the level of the clock signal within corresponding memory devices (e.g., flip-flops) when instructed by the phase shifted clock signals. The level of clock signal may be at a high level (e.g., the clock signal has the value "1") or a low level (e.g., the clock signal has the value "0").

A "phase selection table" stores multiple entries. Each of the entries includes multiple clock level values. A transition point is where the clock signal transitions from a high level to a low level or vice versa. This transition point signifies a 180 degree phase shift. Using this transition point, other phase shifts can be determined. For example, a 90 degree phase shift occurs in the middle between the rising edge of the clock signal's high level and the transition point. Each of the entries indicate a different time when the clock signal transitions from one level to another level. Depending on when the transition of the clock signal occurs, a particular one of the entries, corresponding to the transition indicates a particular one of the multiple delay units that provides the desired clock phase shift amount. The output from this delay unit is transmitted to an external device that uses the clock signal having this phase shift.

Figure 1:
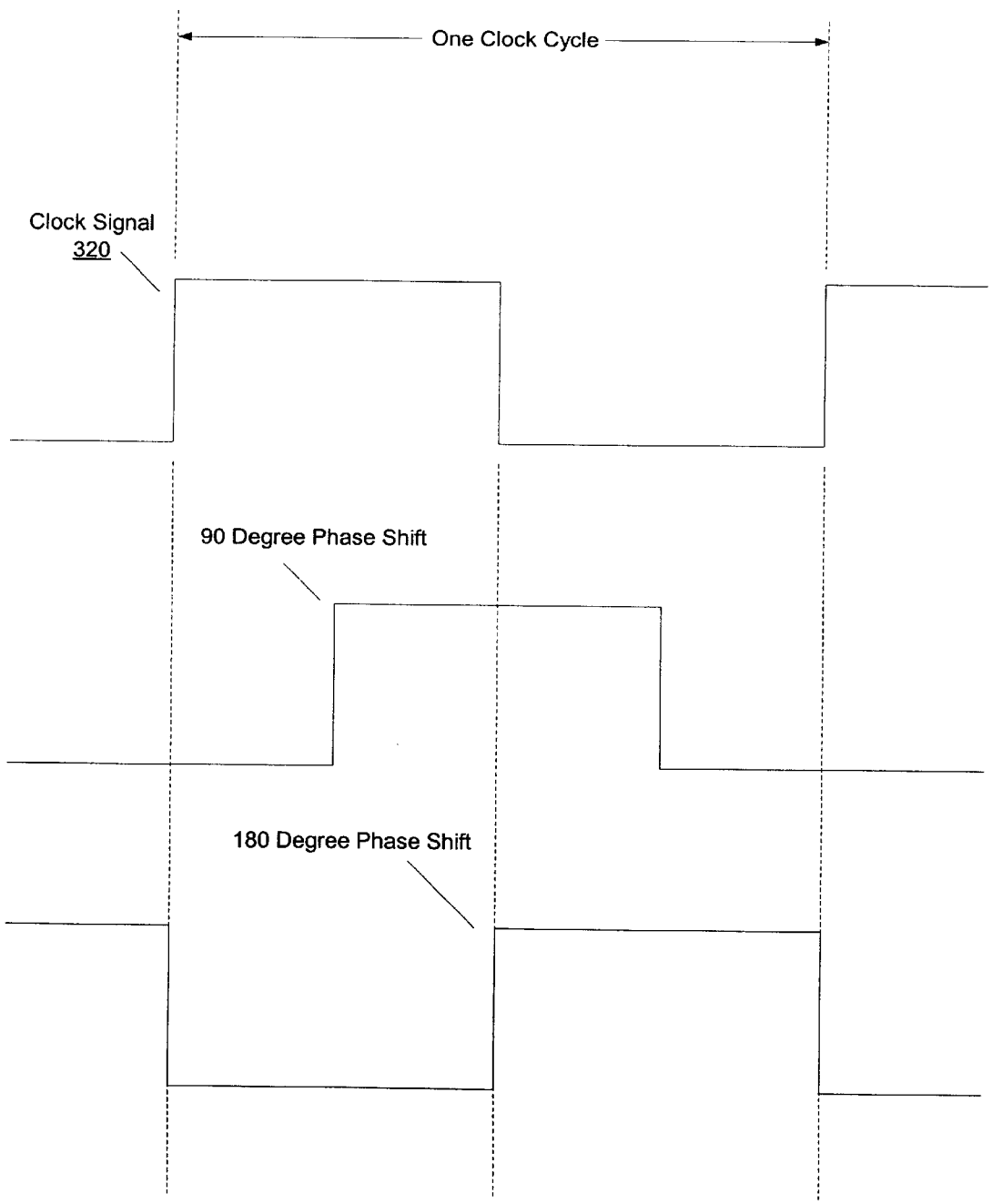
FIG. 1 shows examples of various phase shifts of a clock signal.

FIG. 1 shows examples of various phase shifts of a clock signal 320. In FIG. 1, one complete cycle of the clock signal 320 is identified. A 360 degree phase shift results in shifting the clock signal 320 by one complete cycle. Similarly, a 180 degree phase shift results in shifting the clock signal 320 by one half clock cycle, and a 90 degree phase shift results in shifting the clock signal 320 by one fourth clock cycle.

Figure 2:
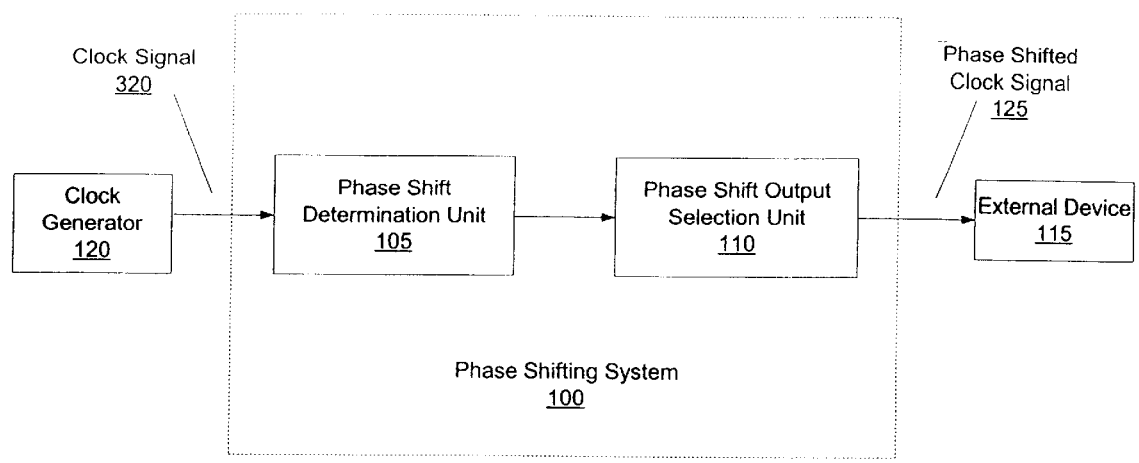
FIG. 2 shows an embodiment of a phase shifting system according to the present invention.

FIG. 2 shows an embodiment of a phase shifting system 100 according to the present invention. In this embodiment, the phase shifting system 100 is used to shift the phase of the clock signal 320 by 90 degrees to produce a phase shifted clock signal 125. This embodiment is not limited to shifting the clock phase by 90 degrees and in other configurations, the clock phase is shifted by other amounts by using, for example, different numbers of delay units, memory devices, and entries in a "phase selection table". The phase shifting system 100 includes a phase shift determination unit 105 that generates a phase shifted clock signals and determines which one of the phase shifted clock signals provides the 90 degree phase shift. The phase shifting system 100 also includes a phase shift output selection unit 110 that selects as its output the clock signal that is phase shifted by 90 degrees (i.e., the phase shifted clock signal 125). The phase shifted clock signal 125 is sent to an external device 115 that operates using a clock signal that is phase shifted by 90 degrees. The external device 115 may be, for example, a memory chip that operates on a 90 degree phase shifted clock signal.

Figure 3:
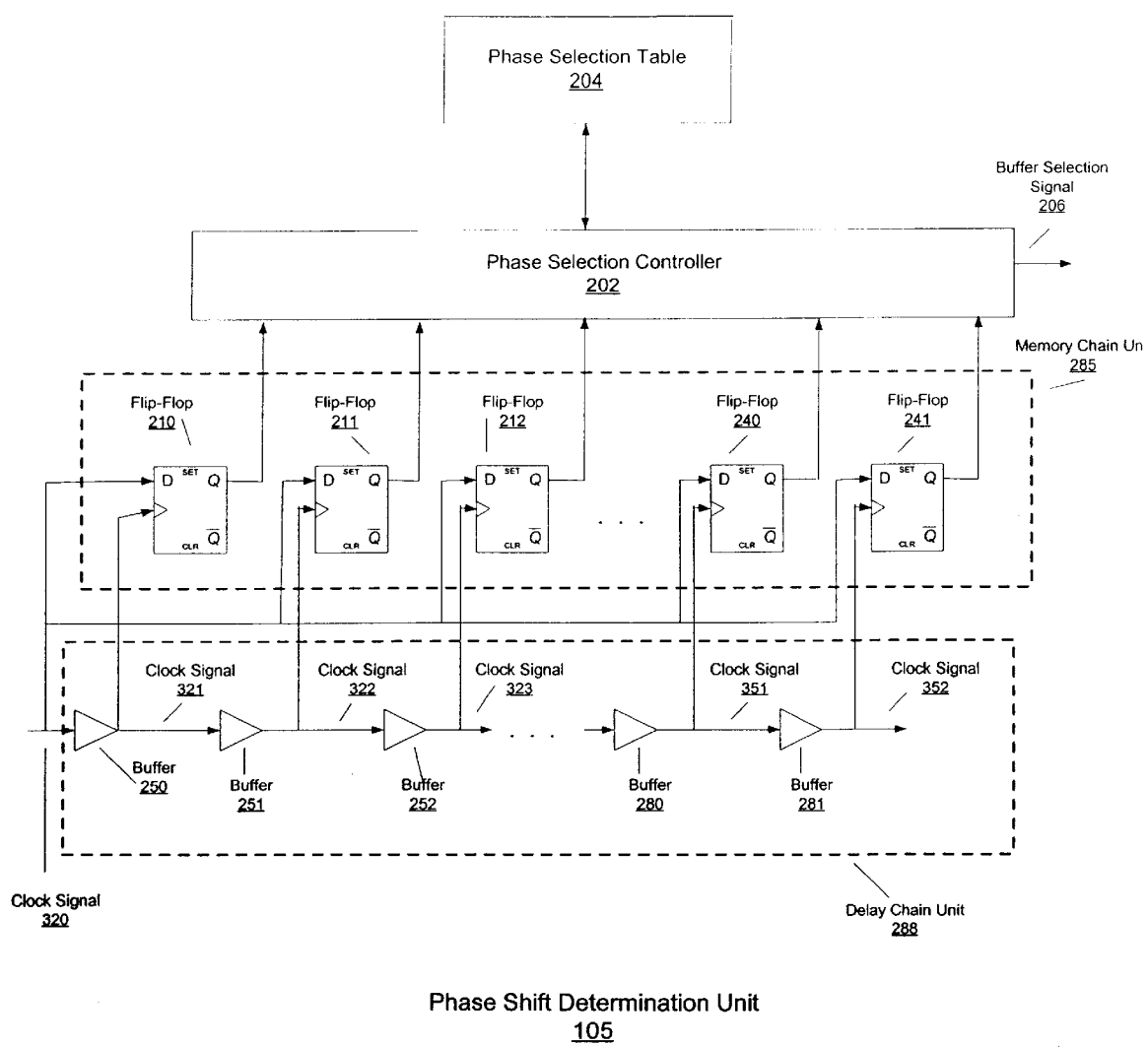
FIG. 3 shows an embodiment of a phase shift determination unit according to the present invention.

FIG. 3 shows an embodiment of the phase shift determination unit 105 according to the present invention. In this embodiment, a delay chain unit 288 includes multiple delay units that are coupled together to form a chain. The delay units are, for example, buffers (e.g., a buffer is comprised of two coupled inverters). A memory chain unit 285 is coupled to the delay chain unit 288. The memory chain unit 285 includes multiple memory devices, each one of the memory devices corresponds to one of the delay units. The memory devices are, for example, flip flops such as D-type flip-flops. In this embodiment, the clock signal 320 is input into a buffer 250. The buffers 250–281 form a chain of buffers. The buffer 250 shifts the phase of the clock signal 320 by some amount to produce a phase shifted clock signal 321. The amount of phase shift produced by each of the buffers may be fixed or may vary. The clock signal 320 is transmitted to a D-terminal of each of the flip-flops 210–241. The phase shifted clock signal 321 is transmitted to the clock-terminal of the flip-flop 210. The flip-flop 210 stores the level of the clock signal 320 at the time when the flip-flop 210 is triggered by the phase shifted clock signal 321. The flip-flop 210 outputs the stored clock level (e.g., the clock level is a "0" or a "1") to a phase selection controller 202.

In the same way, each of the buffers 251–281 phase shift each of the clock signals 321–351 by some amount and send these phase shifted clock signals to the clock-terminal of the corresponding one of the flip-flops 211–241. Each of the flip-flops 211–241 stores the level of the clock signal 320 at the time when the particular one of the flip-flops 211–241 is triggered by the corresponding one of the clock signals 322–352. Each of the flip-flops 211–241 outputs its stored clock level to the phase selection controller 202 to be analyzed to determine which one of the buffers 250–281 provides a clock signal that is phase shifted by 90 degrees. In this embodiment, there are thirty-two buffers and thirty-two corresponding flip flops. The number of buffers and flip flops used here is for illustration purposes only and varies depending on the desired accuracy and the preference of the implementer.

The phase selection controller 202, using a phase selection table 204 and the clock levels stored in the flip-flops 210–241, determines which one of the buffers 250–281 provides the 90 degree phase shift clock signal. A buffer selection signal 206 is output by the phase selection signal and indicates which one of the buffers 250–281 provides the 90 degree phase shift clock signal. The phase selection table 204 includes multiple entries, each of the entries has multiple values that indicate whether the clock signal is at a high level (e.g., the clock signal has a value "1") or a low level (e.g., the clock signal has a value "0"). Each of the entries represent different transition points of the clock signal from the high level to the low level. In another configuration, each of the entries represent different transition points of the clock signal from the low level to the high level. Each of the entries maps to a corresponding one of the buffers 250–281.

FIG. 4 shows an embodiment of the phase selection table 204 according to the present invention. In this embodiment, the phase selection table 204 is a 16×32 table. In this embodiment, the phase selection table 204 has thirty-two columns, one column for each of the thirty-two phase shifts produced by the thirty-two buffers 250–281. The phase selection controller 202 collectively compares the clock levels stored in the flip-flops 210–241 with the entries in the phase selection table 204. Each of the entries is a 32-value sequence of "1"s, "0"s, and "don't cares " (a "don't care" can be either a "1" or "0"). In the phase selection table 204, the "don't cares" are denoted by "?". Each of the clock levels stored in the flip-flops 210–241 are either "1"s or "0"s. For the values in each entry and the values stored by the flip-flops 210–241, the value of "1" indicates that the clock signal is at a high level, and a value of "0" indicates that the clock signal is at a low level. If the sequence of "1"s and "0"s stored in the flip flops 210–241 matches a particular one of the entries in the phase selection table 204, then a particular one of the buffers 250–281 corresponding to that entry provides the 90 degree phase shifted clock signal. The particular one of the buffers 250–281 providing the 90 degree phase shift is indicated by the buffer selection signal 206.

Each of the entries in the phase selection table 204 represent a different time when the clock signal transitions from the high level to the low level. For example, for entry 1, the clock signal transitions from the high level (i.e., "1") to the low level (i.e., "0") at position 3. For entry 2, the clock signal transitions from the high level to the low level at position 5. By providing different times at which the clock signal transitions, the entries indicate a particular one of the delay units that provides the desired 90 degree phase shift independently of foundry variations, and temperature and voltage variations.

The clock signal's transition from the high level to the low level (e.g., the transition from a "1" to a "0") signifies the point at which a 180 degree phase shift occurs and the middle point of that high level signifies the 90 degree phase shift. The following shows an example of comparing the values in the flip flops 210–241 with the entries in the phase selection table 204 to select the particular one of the buffers 250–281 that provides the 90 degree phase shift. If the flip flop 210 stores the value "1", the flip-flop 211 stores either a "1" or "0" (i.e., the value stored by the flip-flop 211 is a "don't care"), the flip-flop 212 stores the value "1", the flip-flop 213 stores either a "1" or "0", the flip-flop 214 stores the value "0", and the flip-flops 215–241 store either a "1" or "0", then these phase shifted clock signal values match entry two of the phase selection table 204. The "buffer selection signal" column of the phase selection table 204 for entry two specifies the buffer 252 and thus the buffer 252 provides the desired 90 degree phase shift clock signal.

Therefore, the phase selection controller 202 assigns the buffer selection signal 206 to denote the buffer 252. Each of the values listed in the "buffer selection signal" column specifies a corresponding one of the buffers 250–281 that provides the 90 degree phase shift clock signal given the particular transition point of the clock signal from "1" to "0".

In other embodiments, the phase selection table 204 has different sizes to account, for example, for different number of memory devices or to provide a different amount of accuracy. The values in each of the entries also differ to provide different amounts of phase shift. In other embodiments, the phase selection table 204 is populated with different values, such as, for example, only "1"s and "0"s.

Figure 5:
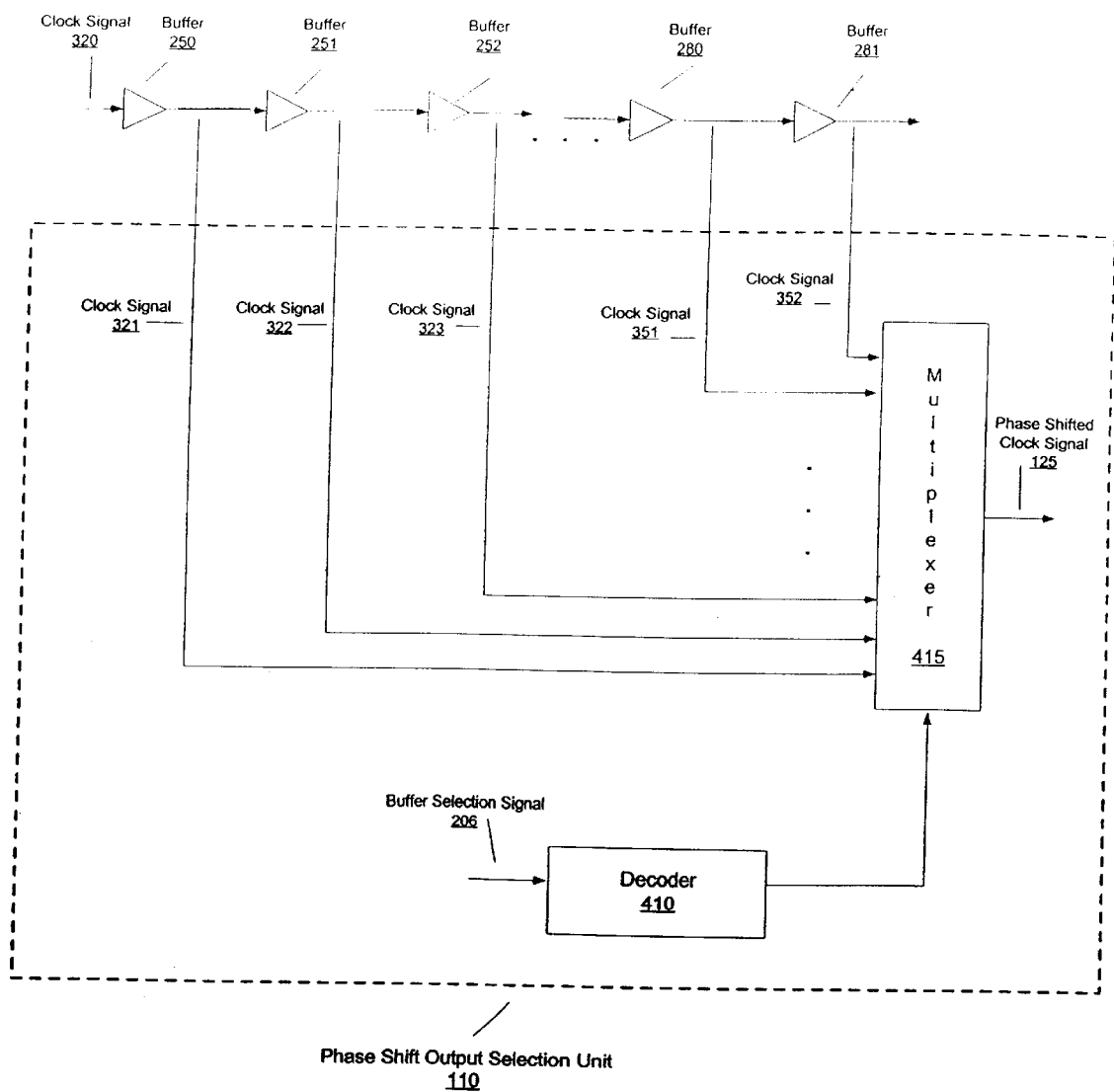
FIG. 5 shows an embodiment of a phase shift output selection unit according to the present invention.

FIG. 5 shows an embodiment of the phase shift output selection unit 110 according to the present invention. The phase shift output selection unit 110 includes a decoder 410 that converts the input, i.e., the buffer selection signal 206, to an output that instructs a multiplexer 415 to select as its output (i.e., the multiplexer 415's output is the phase shifted clock signal 125) a particular one of the clock signals 321–352 that is phase shifted by 90 degrees. The clock signals 321–352 are input into the multiplexer 415 that selects as its output (that output is the phase shifted clock signal 125) a particular one of those inputs; the multiplexer 415 selects the output using the decoded buffer selection signal 206 provided by the decoder 410.

Figure 6:
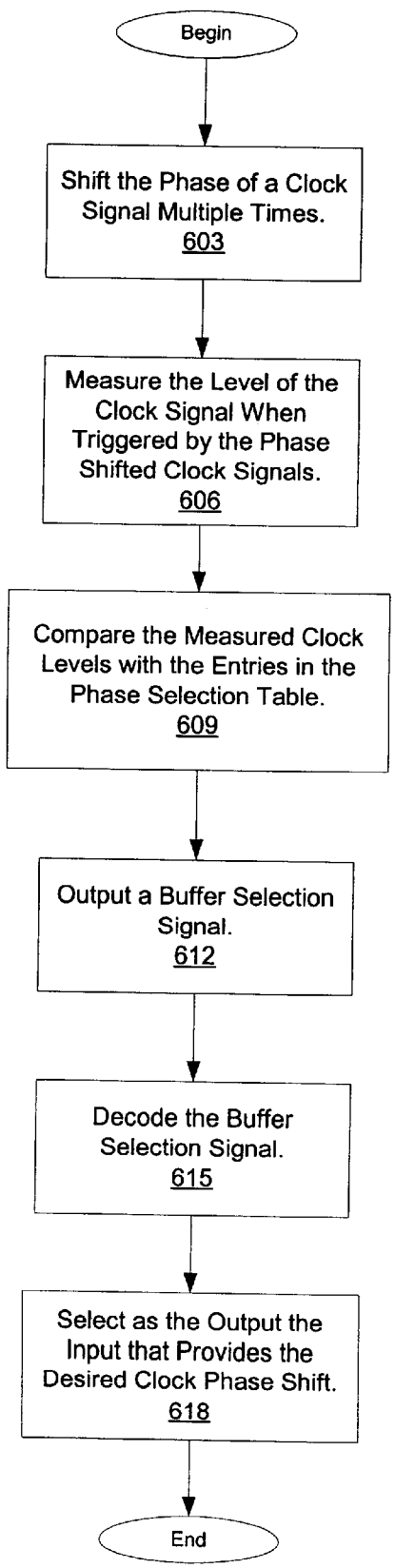
FIG. 6 shows a flowchart of an embodiment of a method to phase shift a clock signal according to the present invention.

FIG. 6 shows a flowchart of an embodiment of a method to phase shift the clock signal the desired amount according to the present invention. In block 603, the phase of the clock signal 320 is shifted multiple times to produce phase shifted clock signals. Each of the phase shifted clock signals is produced by a delay unit. In block 606, the level of the clock signal 320 is measured when the flip-flops 210–241 are triggered by the phase shifted clock signals. Each of the measured clock levels are stored in the corresponding one of the flip-flops 210–241. In block 609, the clock levels stored in the flip-flops 210–241 are compared to the entries in the phase selection table 204. When a match is found, the matching entry specifies a particular one of the buffers 250–281 that provides the desired clock phase shift. In block 612, a buffer selection signal is output that specifies the particular one of the phase shifted clock signals produced by the particular one of the buffers 250–281 specified by the matching entry that provides the desired clock phase shift. In block 615, the buffer selection signal is decoded to determine which one of the phase shifted clock signals provides the desired phase shift. In block 618, the decoded buffer selection signal is used to select the particular one of the phase shifted clock signals that provides the desired clock phase shift. The selected phase shifted clock signal is sent to an external device whose operation is dependent on the phase shifted clock signal.

While the present invention has been particularly described with respect to the illustrated embodiments, it will be appreciated that various alterations, modifications and adaptations may be based on the present disclosure, and are intended to be within the scope of the present invention. While the invention has been described in connection With what are presently considered to be the most practical and preferred embodiments, it is to be understood that the present invention is not limited to the disclosed embodiment but, on the contrary, is intended to cover various modifications and equivalent arrangements included within the scope of the claims.

What is claimed is:

1. A system to shift the phase of a clock signal by a desired phase shift amount, comprising:
   a phase shift determination unit to generate a plurality of phase shifted clock signals and to determine a particular one of the plurality of phase shifted clock signals that provides the desired phase shift amount, wherein the phase shift determination unit includes:
      a memory chain unit to gather a plurality of clock characteristics of the clock signal when triggered by the plurality of phase shifted clock signals; and
   a phase selection table to store a plurality of phase selection entries.

2. The system of claim 1 further comprising
   a phase shift output selection unit, coupled to the phase shift determination unit, to select as an output the particular one of the plurality of phase shifted clock signals.

3. The system of claim 2 wherein the phase shift determination unit further includes
   a delay chain unit to shift the clock signal a plurality of times to produce the plurality of phase shifted clock signals, wherein the delay chain unit is coupled to the memory chain unit;
   a phase selection controller, coupled to the memory chain unit and the phase selection table, to process the plurality of clock characteristics to find the particular one of the plurality of phase shifted clock signals that provides the desired phase shift amount.

4. The system of claim 3 wherein
   the delay chain unit includes a plurality of delay units, each of the plurality of delay units coupled together to form a chain, wherein each of the plurality of delay units shifts the clock signal to produce a particular one of the plurality of phase shifted clock signals; and
   the memory chain unit includes a plurality of memory devices, each of the plurality of memory devices coupled to a corresponding one of the plurality of delay units, wherein each of the plurality of memory devices gathers a particular one of the plurality of clock characteristics of the clock signal when triggered by a particular one of the plurality of phase shifted clock signals.

5. The system of claim 4 wherein the phase shift output selection unit includes
   a decoder to decode a buffer selection signal; and
   a multiplexer having a plurality of inputs and an output, each of the plurality of inputs coupled to an output of a corresponding one of the plurality of delay units, and the output selected by the decoded buffer selection signal.

6. The system of claim 4 wherein the plurality of delay units is a plurality of buffers.

7. The system of claim 6 wherein each of the plurality of buffers is two invertors that are coupled together.

8. The system of claim 4 wherein the plurality of memory devices is a plurality of flip-flops.

9. The system of claim 8 wherein the plurality of flip-flops are a plurality of D-type flip-flops.

10. The system of claim 3 wherein each of the plurality of clock characteristics indicates whether the clock signal is at a high level or at a low level.

11. The system of claim 3 wherein each of the plurality of phase selection entries is a plurality of values, each of the plurality of values indicates whether the clock signal is at least one of a high level and a low level.

12. The system of claim 11 wherein each of the plurality of phase selection entries has a different transition point where a particular one of the plurality of values is at the high level and the next one of the plurality of values is at the low level.

13. The system of claim 12 wherein each of the plurality of phase selection entries corresponds to a particular one of the plurality of delay units.

14. The system of claim 13 wherein a match between the plurality of clock characteristics and a particular one of the plurality of phase selection entries indicates that the corresponding one of the plurality of delay units provides the particular one of the plurality of phase shifted clock signals having the desired phase shift amount.

15. The system of claim 1 wherein the desired phase shift amount is 90 degrees.

16. A method to shift the phase of a clock signal by a desired phase shift amount, comprising:
generating a plurality of phase shifted clock signals; and
determining a particular one of the plurality of phase shifted clock signals that provides the desired phase shift amount, wherein the determining includes:
gathering a plurality of clock characteristics of the clock signal at a plurality of different times based on the plurality of phase shifted clock signals, wherein the gathering includes measuring a level of the clock signal when triggered by the plurality of phase shifted clock signals to produce a plurality of clock level values; and
processing the plurality of clock characteristics to find, based on the plurality of different times, the particular one of the plurality of phase shifted clock signals that provides the desired phase shift amount, wherein the processing includes comparing the plurality of clock level values with at least one of a plurality of phase selection entries to find a particular one of the plurality of phase selection entries that matches the plurality of clock level values.

17. The method of claim 16 further comprising outputting the particular one of the plurality of phase shifted clock signals.

18. The method of claim 16 wherein generating the plurality of phase shifted clock signals includes shifting the clock signal a plurality of times to produce the plurality of phase shifted clock signals.

19. The method of claim 16 wherein
processing the plurality of clock characteristics further includes
outputting a buffer selection signal indicated by the matching one of the plurality of phase selection entries.

20. The method of claim 17 wherein outputting the particular one of the plurality of phase shifted clock signals includes
selecting as an output the particular one of the plurality of phase shifted clock signals that provides the desired phase shift amount.

21. The method of claim 20 wherein selecting as an output the particular one of the plurality of phase shifted clock signals that provides the desired phase shift amount includes
decoding a buffer selection signal to determine the particular one of the plurality of phase shifted clock signals that provides the desired phase shift amount; and
based on the decoded buffer selection signal, selecting as an output the particular one of the plurality of phase shifted clock signals that provides the desired phase shift amount.

22. The method of claim 19 wherein each of the plurality of clock level values indicates whether the clock signal is at a high level or at a low level.

23. The method of claim 19 wherein each of the plurality of phase selection entries is a plurality of values, each of the plurality of values indicates whether the clock signal is at least one of a high level and a low level.

24. The method of claim 23 wherein each of the plurality of phase selection entries has a different transition point where a particular one of the plurality of values is at the high level and a next one of the plurality of values is at the low level.

25. The method of claim 24 wherein the plurality of phase selection entries has different transition points in order to determine the particular one of the plurality of phase shifted clock signals that provides the desired phase shift amount independent of operating condition variations.

26. The method of claim 16 wherein the desired phase shift amount is 90 degrees.

27. A system to shift the phase of a clock signal by a desired phase shift amount, comprising:
a plurality of delay units, each of the plurality of delay units coupled together to form a chain, the plurality of delay units shift the clock signal a plurality of times to generate a plurality of phase shifted clock signals;
a plurality of memory devices, each of the plurality of memory devices coupled to a corresponding one of the plurality of delay units, to store a plurality of clock characteristics of the clock signal when triggered by the plurality of phase shifted clock signals;
a phase selection table that indicates a particular one of the plurality of delay units that provides a particular one of the plurality of phase shifted clock signals that has the desired phase shift amount; and
a phase selection controller, coupled to the plurality of memory devices and the phase selection table, to process the plurality of clock characteristics to find the particular one of the plurality of phase shifted clock signals that has the desired phase shift amount.

28. The system of claim 27 further comprising
a decoder to decode a buffer selection signal output by the phase selection controller; and
a multiplexer having a plurality of inputs and an output, each of the plurality of inputs coupled to an output of a corresponding one of the plurality of delay units, and the output selected by the decoded buffer selection signal.

29. The system of claim 27 wherein the phase selection table includes a plurality of entries, each of the plurality of entries corresponds to a particular one of the plurality of delay units.

30. The system of claim 29 wherein
each of the plurality of entries includes a plurality of values, each of the plurality of values indicates whether the clock signal is at least one of a high level and a low level;
each of the plurality of clock characteristics indicates whether the clock signal is at a high level or a low level; and
a match between a particular one of the plurality of entries and the plurality of clock characteristics indicates the corresponding one of the plurality of delay units that provides the particular one of the plurality of phase shifted clock signals that has the desired phase shift amount.

31. The system of claim 27 wherein the plurality of delay units is a plurality of buffers.

32. The system of claim 31 wherein each of the plurality of buffers is two invertors that are coupled together.

33. The system of claim 27 wherein the plurality of memory devices is a plurality of flip-flops.

34. The system of claim 27 wherein the desired phase shift amount is 90 degrees.

* * * * *